(12) United States Patent
Meunier et al.

(10) Patent No.: US 10,028,407 B2
(45) Date of Patent: Jul. 17, 2018

(54) LATCH ASSEMBLY INCORPORATING A FAN BRAKE ACTUATOR FOR USE IN A COOLING UNIT OF A TELECOMMUNICATIONS SYSTEM

(71) Applicant: Ciena Corporation, Hanover, MD (US)

(72) Inventors: Trevor Meunier, Kemptville (CA); Peter Saturley, Ottawa (CA)

(73) Assignee: Ciena Corporation, Hanover, MD (US)

( * ) Notice: Subject to any disclaimer, the term of this patent is extended or adjusted under 35 U.S.C. 154(b) by 478 days.

(21) Appl. No.: 14/827,605

(22) Filed: Aug. 17, 2015

(65) Prior Publication Data
US 2017/0055354 A1 Feb. 23, 2017

(51) Int. Cl.
- H05K 5/00 (2006.01)
- H05K 7/20 (2006.01)
- H05K 7/14 (2006.01)

(52) U.S. Cl.
CPC ....... H05K 7/20136 (2013.01); H05K 7/1409 (2013.01); H05K 7/20581 (2013.01)

(58) Field of Classification Search
CPC ............. H05K 7/20136; H05K 7/1409; H05K 7/20581
USPC .......................................... 361/801–803, 759
See application file for complete search history.

(56) References Cited

U.S. PATENT DOCUMENTS

| | | | | |
|---|---|---|---|---|
| 5,293,303 A * | 3/1994 | Fletcher | ............... | H05K 7/1409 211/41.17 |
| 6,266,248 B1 * | 7/2001 | Hanas | .................. | H05K 7/1409 361/752 |
| 6,373,713 B1 * | 4/2002 | Jensen | ................. | H05K 7/1409 211/41.17 |
| 6,735,089 B1 * | 5/2004 | Byers | ................... | H05K 7/1409 361/747 |
| 6,961,249 B2 * | 11/2005 | Wong | ................... | H05K 7/1409 361/754 |
| 7,301,778 B1 * | 11/2007 | Fang | .................... | H05K 7/1409 312/223.2 |
| 7,679,933 B2 * | 3/2010 | Makabe | ................. | G06F 1/185 174/365 |
| 2007/0064385 A1 * | 3/2007 | Paul | ....................... | G06F 1/187 361/679.4 |

* cited by examiner

Primary Examiner — Hung S Bui
(74) Attorney, Agent, or Firm — Clements Bernard Walker PLLC; Christopher L. Bernard; Lawrence A. Baratta, Jr.

(57) ABSTRACT

A latch assembly for a cooling unit of a telecommunications shelf assembly, the latch assembly including: a faceplate; a latch handle movably coupled to the faceplate, wherein, when the latch handle is actuated, the cooling unit is attached to/released from the shelf assembly; and a locking mechanism coupled to the latch handle, wherein, when the locking mechanism is actuated, the cooling unit is locked to/unlocked from the shelf assembly; wherein the locking mechanism includes a fan brake actuator mechanism that is coupled to an electronic fan brake switch associated with one or more fans of the cooling unit. Optionally, the latch handle is pivotably coupled to the faceplate and is actuated by rotation. Optionally, the locking mechanism includes a captive screw that is advanced into/backed out of a threaded aperture associated with the faceplate. Optionally, the fan brake actuator mechanism includes a lever member that couples the locking mechanism to the electronic fan brake switch.

18 Claims, 7 Drawing Sheets

LATCH ASSEMBLY INCORPORATING A FAN BRAKE ACTUATOR FOR USE IN A COOLING UNIT OF A TELECOMMUNICATIONS SYSTEM

FIELD OF THE INVENTION

The present invention relates generally to telecommunications systems and methods. More specifically, the present invention relates to a latch assembly incorporating a fan brake actuator for use in a cooling unit of a telecommunications system.

BACKGROUND OF THE INVENTION

Conventional cooling units of telecommunications systems incorporate an electronic fan brake that stops the spinning fans when the power to the cooling unit is interrupted, such as when the cooling unit is removed from the associated shelf assembly. The intent is to prevent an operator that is removing the cooling unit from the shelf assembly and/or the fan from the cooling unit from being exposed to spinning fan blades, which spin at a relatively high velocity for newer telecommunications systems. As cooling requirements increase, the fans run at higher and higher speeds and take longer and longer to stop once the electronic fan brake is engaged. These fans can take 2 seconds or more to stop—longer than it takes to remove the cooling unit from the shelf assembly. This puts fingers and the like in danger.

Newer telecommunications systems utilize relatively large cooling units that are secured via a latch mechanism that is rotatably engaged and disengaged. The natural tendency of an operator when removing such a cooling unit is to place one hand on the latch handle and pull, thereby rotating the latch mechanism, using the other hand to take the weight of the cooling unit from underneath. This can result in a hazardous condition if the exposed fans are still spinning. As stated herein above, most conventional fans have a spin down time of several seconds, and are still spinning when the cooling unit is removed from the shelf assembly.

It should be noted that, in telecommunications systems that do not utilize an electronic fan brake, it is common to cover the fans with grates that have openings that are too small to admit a finger. Disadvantageously, these grates reduce the cooling performance of the fans and increase acoustic noise.

Thus, what is still needed in the art is an improved cooling unit that utilizes a latch assembly that triggers the electronic fan brake earlier, such that the fans are not still spinning when a cooling unit is removed from a shelf assembly. The present invention provides such an improved cooling unit, thereby minimizing the risk of operator injury.

BRIEF SUMMARY OF THE INVENTION

In a variety of exemplary embodiments, the present invention provides an improved cooling unit that utilizes a latch assembly that triggers the electronic fan brake earlier, providing the fans with several seconds to stop when the cooling unit is removed from the shelf assembly, thereby minimizing the risk of operator injury. In fact, the improved cooling unit of the present invention includes fans that are stopped well in advance of the removal of the cooling unit from the shelf assembly. This is accomplished via the use of a captive screw or the like on the latch assembly that is coupled to the switch of the electronic fan brake and acts as a fan brake actuator. This captive screw takes several seconds to disengage, thereby providing the spinning fans with several seconds to stop once the fan brake actuator is actuated.

In one exemplary embodiment, the present invention provides a latch assembly for a cooling unit of a telecommunications shelf assembly, the latch assembly including: a faceplate; a latch handle movably coupled to the faceplate, wherein, when the latch handle is actuated, the cooling unit is attached to/released from the shelf assembly; and a locking mechanism coupled to the latch handle, wherein, when the locking mechanism is actuated, the cooling unit is locked to/unlocked from the shelf assembly; wherein the locking mechanism includes a fan brake actuator mechanism that is coupled to an electronic fan brake switch associated with one or more fans of the cooling unit. Optionally, the latch handle is pivotably coupled to the faceplate and is actuated by rotation. Optionally, the locking mechanism includes a captive screw that is advanced into/backed out of a threaded aperture associated with the faceplate. Optionally, the fan brake actuator mechanism includes a lever member that couples the locking mechanism to the electronic fan brake switch. A first end of the lever member is coupled to the faceplate, a second end of the lever member contacts the electronic fan brake switch, and the locking mechanism contacts the lever member between the first end and the second end of the lever member. Optionally, the lever member comprises a light pipe that transmits light from an interior portion of the cooling unit to an exterior portion of the cooling unit.

In another exemplary embodiment, the present invention provides a cooling unit of a telecommunications shelf assembly, the cooling unit including: a faceplate; and a latch assembly, including: a latch handle movably coupled to the faceplate, wherein, when the latch handle is actuated, the cooling unit is attached to/released from the shelf assembly; and a locking mechanism coupled to the latch handle, wherein, when the locking mechanism is actuated, the cooling unit is locked to/unlocked from the shelf assembly; wherein the locking mechanism includes a fan brake actuator mechanism that is coupled to an electronic fan brake switch associated with one or more fans of the cooling unit. Optionally, the latch handle is pivotably coupled to the faceplate and is actuated by rotation. Optionally, the locking mechanism includes a captive screw that is advanced into/backed out of a threaded aperture associated with the faceplate. Optionally, the fan brake actuator mechanism includes a lever member that couples the locking mechanism to the electronic fan brake switch. A first end of the lever member is coupled to the faceplate, a second end of the lever member contacts the electronic fan brake switch, and the locking mechanism contacts the lever member between the first end and the second end of the lever member. Optionally, the lever member comprises a light pipe that transmits light from an interior portion of the cooling unit to an exterior portion of the cooling unit.

In a further exemplary embodiment, the present invention provides a method for providing and using a latch assembly for a cooling unit of a telecommunications shelf assembly, method comprising: providing a faceplate; providing a latch handle movably coupled to the faceplate, wherein, when the latch handle is actuated, the cooling unit is attached to/released from the shelf assembly; providing a locking mechanism coupled to the latch handle, wherein, when the locking mechanism is actuated, the cooling unit is locked to/unlocked from the shelf assembly; wherein the locking mechanism includes a fan brake actuator mechanism that is coupled to an electronic fan brake switch associated with one or more fans of the cooling unit; actuating the locking mechanism to actuate the electronic fan brake switch; and actuating the latch handle to attach the cooling unit to/release the cooling unit from the telecommunications shelf assembly. Optionally, the latch handle is pivotably coupled to the faceplate and is actuated by rotation. Optionally, the locking mechanism includes a captive screw that is advanced into/backed out of a threaded aperture associated with the faceplate. Optionally, the fan brake actuator mechanism includes a lever member that couples the locking mechanism to the electronic fan brake switch. A first end of the lever member is coupled to the faceplate, a second end of the lever member contacts the electronic fan brake switch, and the locking mechanism contacts the lever member between the first end and the second end of the lever member. Optionally, the lever member comprises a light pipe that transmits light from an interior portion of the cooling unit to an exterior portion of the cooling unit.

In a still further exemplary embodiment, the present invention provides a shelf assembly for a telecommunications system incorporating a cooling unit and a latch assembly as described herein above.

BRIEF DESCRIPTION OF THE DRAWINGS

The present invention is illustrated and described herein with reference to the various drawings, in which like reference numbers are used to denote like assembly components/method steps, as appropriate, and in which.

DETAILED DESCRIPTION OF THE INVENTION

Figure 1:
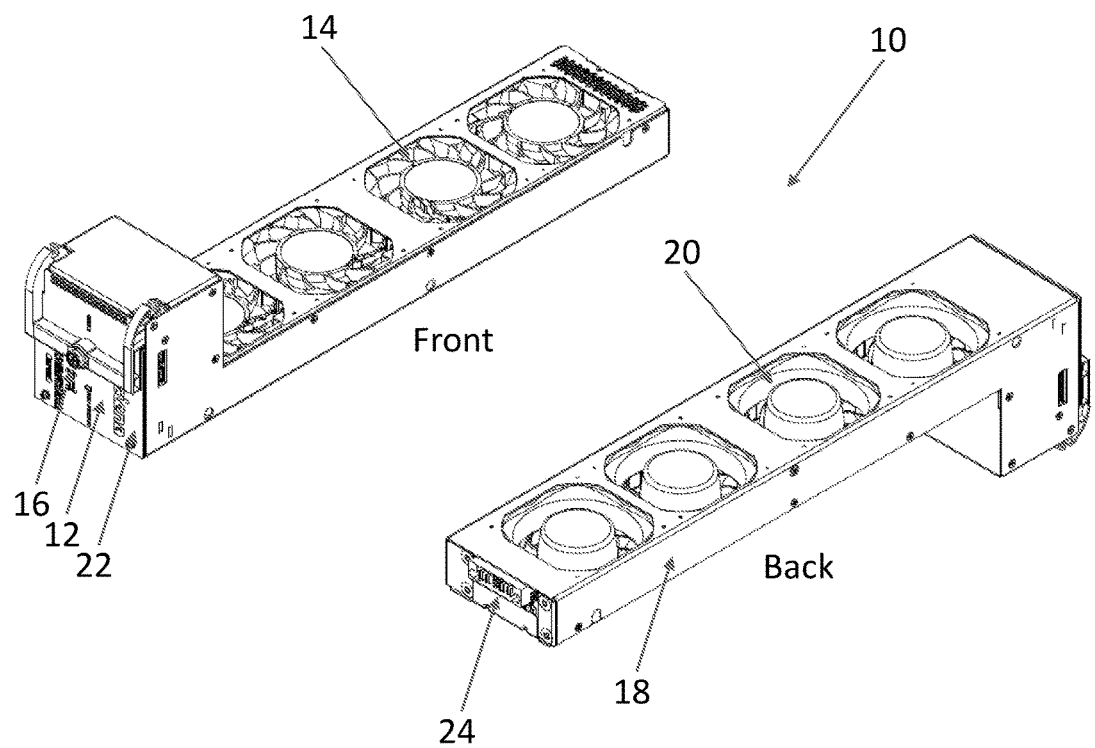
FIG. 1 is a series of perspective views of one exemplary embodiment of the cooling unit of the present invention.

Referring now specifically to FIG. 1, in one exemplary embodiment, the present invention provides an improved cooling unit 10 that utilizes a latch assembly 12 that triggers the electronic fan brake (not illustrated) earlier, providing the fans 14 with several seconds to stop when the cooling unit 10 is removed from the shelf assembly (not illustrated), thereby minimizing the risk of operator injury. In fact, the improved cooling unit 10 of the present invention includes fans 14 that are stopped well in advance of the removal of the cooling unit 10 from the shelf assembly. This is accomplished via the use of a captive screw 16 or the like on the latch assembly 12 that is coupled to the switch (not illustrated) of the electronic fan brake and acts as a fan brake actuator. This captive screw 16 takes several seconds to disengage, thereby providing the spinning fans 14 with several seconds to stop once the fan brake actuator is actuated. As may be seen, the cooling unit includes a housing 18 that defines a plurality of ports 20 in and through which the fans 14 are disposed, such that they may establish a cooling air flow from the interior of a shelf assembly to the external environment, thereby drawing heat off of the shelf assembly. The housing 18 includes a faceplate 22 that typically faces the front portion of the shelf assembly and is accessible by an operator. The housing 18 also includes suitable backplane connections 24 and the like for drawing power from the shelf assembly. In the exemplary embodiment illustrated, four fans 14 utilizing a single electronic fan brake are utilized, although it will be readily apparent to those of ordinary skill in the art that more or fewer fans could be utilized, multiple electronic fan brakes could be utilized, etc. In general, the housing 18 is slid into a corresponding opening in the front of the shelf assembly, secured via actuation of the latch assembly 16, and locked to the shelf assembly via actuation of the captive screw 16. This enables the fans 14. The opposite procedure disables the fans 14 and allows the cooling unit 10 to be removed from the shelf assembly.

Figure 2:
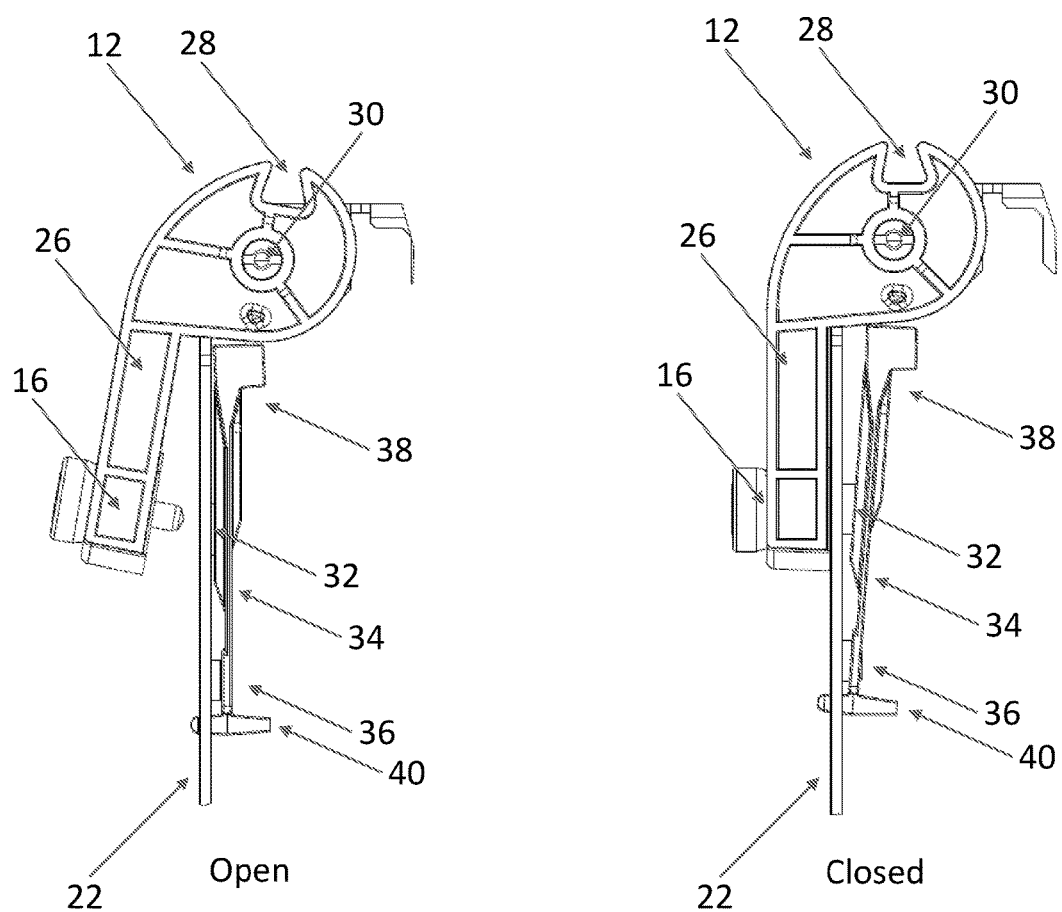
FIG. 2 is a series of side planar views of one exemplary embodiment of the latch assembly of the present invention, in open (fan disabled) and closed (fan enabled) configurations.

Referring now specifically to FIG. 2, in one exemplary embodiment, the latch assembly 12 includes a handle portion 26 to which the captive screw 16 is attached and through which the captive screw 16 protrudes. The latch assembly 12 also includes a pawl portion 28 that is configured to engage a corresponding recess or protrusion (not illustrated) manufactured into or coupled to the shelf assembly. The latch assembly in pivotably coupled to the faceplate 22, such that actuation of the handle portion 26 rotates the pawl portion 28 with respect to the faceplate 22, thereby catching or releasing the recess or protrusion of the shelf assembly and biasing the housing 18 (FIG. 1) into or releasing the housing 18 from the shelf assembly. A pivot pin 30 is provided for this purpose. It will be readily apparent to those of ordinary skill in the art that other comparable mechanisms may be used to bias the housing 18 into or release the housing 18 from the shelf assembly, and may work with the locking mechanism (i.e. captive screw 16) of the present invention.

The captive screw 16, which is rotatably disposed through the handle portion 26 of the latch assembly 12, selectively engages a threaded port 32 that is coupled or adjacent to the faceplate 22. When the captive screw 16 is threaded into the threaded port 32, the handle portion 26 of the latch assembly 12 is drawn towards and secured to the faceplate 22, thereby preventing rotation of the pawl portion 28 of the latch assembly 12 and locking the housing 18 into the shelf assembly. When the captive screw 16 is backed out of the threaded port 32, the opposite occurs. It will be readily apparent to those of ordinary skill in the art that other comparable mechanisms may be used to lock the housing 18 into the shelf assembly. The key aspect is that the actuation of the captive screw 16 or other locking mechanism, whether mechanical or electrical, correspondingly activates the switch (not illustrated) of the electronic fan brake (not illustrated). In this case, a portion of the captive screw 16 protrudes through the faceplate 22 and the threaded port 32, and into the interior of the housing 18 where the switch of the electronic fan brake is located.

In this exemplary embodiment, the captive screw 16 protrudes through the faceplate 22 and the threaded port 32 and engages a deflecting lever member 34 that, when deflected, engages the switch of the electronic fan brake. A first end 36 of the lever member 34 is coupled to the faceplate 22, a second end 38 of the lever member 34 selectively contacts the electronic fan brake switch, and the locking mechanism 16 contacts the lever member 34 between the first end 36 and the second end 38 of the lever member 34. The lever member 34 is described in greater detail herein below.

Thus, the front of the cooling unit 10 (FIG. 1) has a latch handle 26 and a captive screw 16 that are used by the operator to install and remove the cooling unit 10 from the shelf assembly. To install the cooling unit 10 in the shelf assembly and start the fans 14 (FIG. 1) spinning, the latch handle 26 must be closed and the captive screw 16 must be fastened. It is not possible to operate the fans 14 under any other condition. To remove the cooling unit 10, the captive screw 16 must be unfastened before the latch handle 26 can be rotated. The first few turns of the captive screw 16 release the switch, engaging the electronic brake on the fans 14. By the time the captive screw 16 is completely unfastened, the fans 14 have stopped.

The latch handle 26 is rotated to provide the force necessary to insert and remove the cooling unit 10 into and from the shelf assembly. When in the shelf assembly, the latch handle 26 is prevented from rotating by means of the captive screw 16, which engages into the threaded port 32 of the cooling unit 10. This prevents the cooling unit from being accidentally removed or dislodged from the shelf assembly. This type of latching system is not unusual in the industry, but the addition of the actuator mechanism makes the operation unique.

When the captive screw 16 is engaged, it causes the lever member 34 to flex inwards. The first end 36 of the actuator 34 is fixed in position via a screw, but the second end 38 moves towards the switch mounted on a PCB assembly, which closes when the captive screw 16 is fully engaged. The fans 14 can only turn when the switch is closed, and when the switch is subsequently opened, the electronic brake on the fans 14 engages and the fans 14 spin down. It should be noted that the electronic brake is not instantaneous; the fans 14 take several seconds to stop rotating.

To remove the cooling unit 10 while it is in operation, the captive screw 16 must be unfastened. The geometry of the actuator 34 is designed such that the switch opens and the electronic brake engages well before the captive screw 16 disengages and the latch handle 26 can rotate open and disengage from the shelf assembly, ensuring that the cooling unit 10 cannot be removed before the fans 14 have stopped rotating.

This actuator mechanism is relatively small in size, is simple to assemble, and incorporates other useful features, such as a light pipe 40 (which makes an indicator LED visible through the faceplate 22) and a stop to prevent over travel from damaging the switch. The geometry of the actuator mechanism also allows it to trip a second redundant switch at the same time. These features are described in greater detail herein below. This design is more robust than placing the switches on cable assemblies, and it allows simple PCB mounted switches to be used, which are contained entirely inside the cooling unit 10. The ability to choose favorable geometry for the region of the actuator mechanism that interfaces with the captive screw 16 means that considerable margin is present in the time between the disengagement of the switch and the moment at which a fan 14 is exposed to the operator. Although these captive screws 16 are generally rotated using hand tools, using a high speed drill or electric screw driver still does not expose the operator to a rotating fan 14. Finally, the use of switches to engage the fans 14 means that it is not possible to defeat the actuator mechanism by simply latching the cooling unit 10 in place and leaving the captive screw 16 disengaged. The captive screw 16 must be fully engaged before the fans 14 will start to function.

Figure 3:
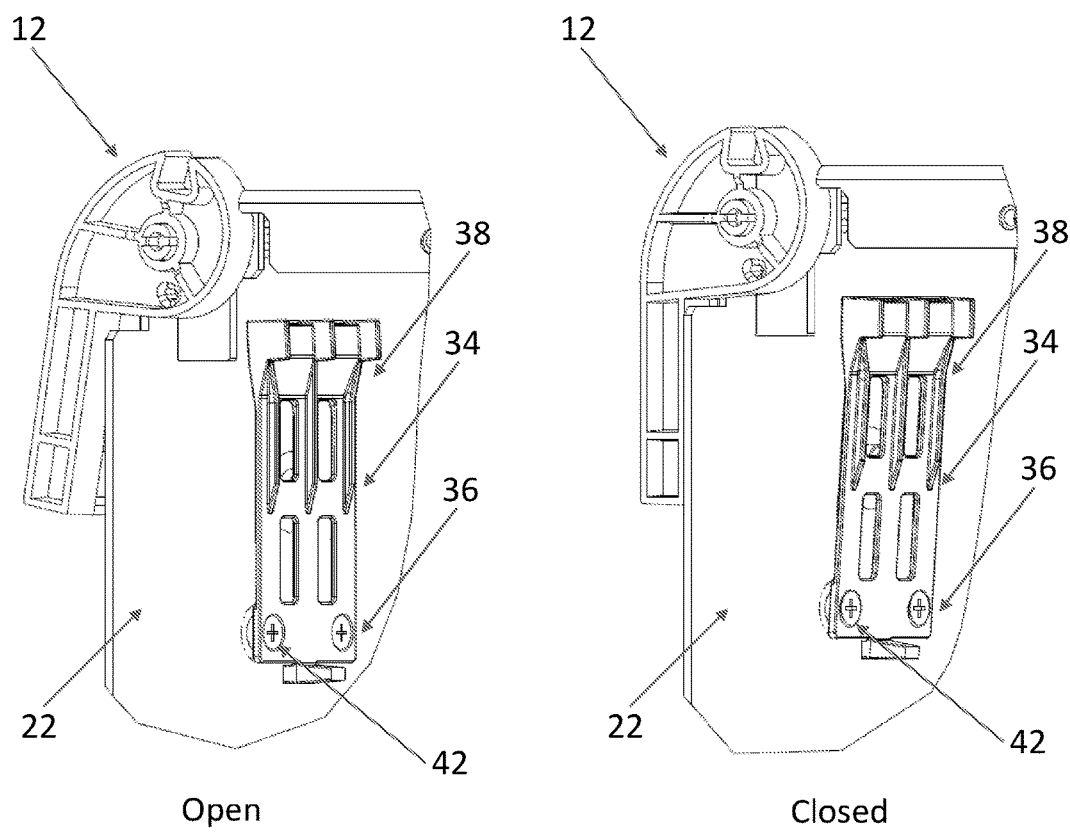
FIG. 3 is a series of partial perspective views of one exemplary embodiment of the latch assembly of the present invention, in open (fan disabled) and closed (fan enabled) configurations, highlighting the operation of the latch handle and lever member.

FIG. 3 illustrates the attachment of the first end 36 the lever member 34 to the faceplate 22 via a plurality of screws 42 and the deflection of the second end 38 of the lever member 34 with the actuation of the latch assembly 22, showing both open and closed configurations.

Figure 4:
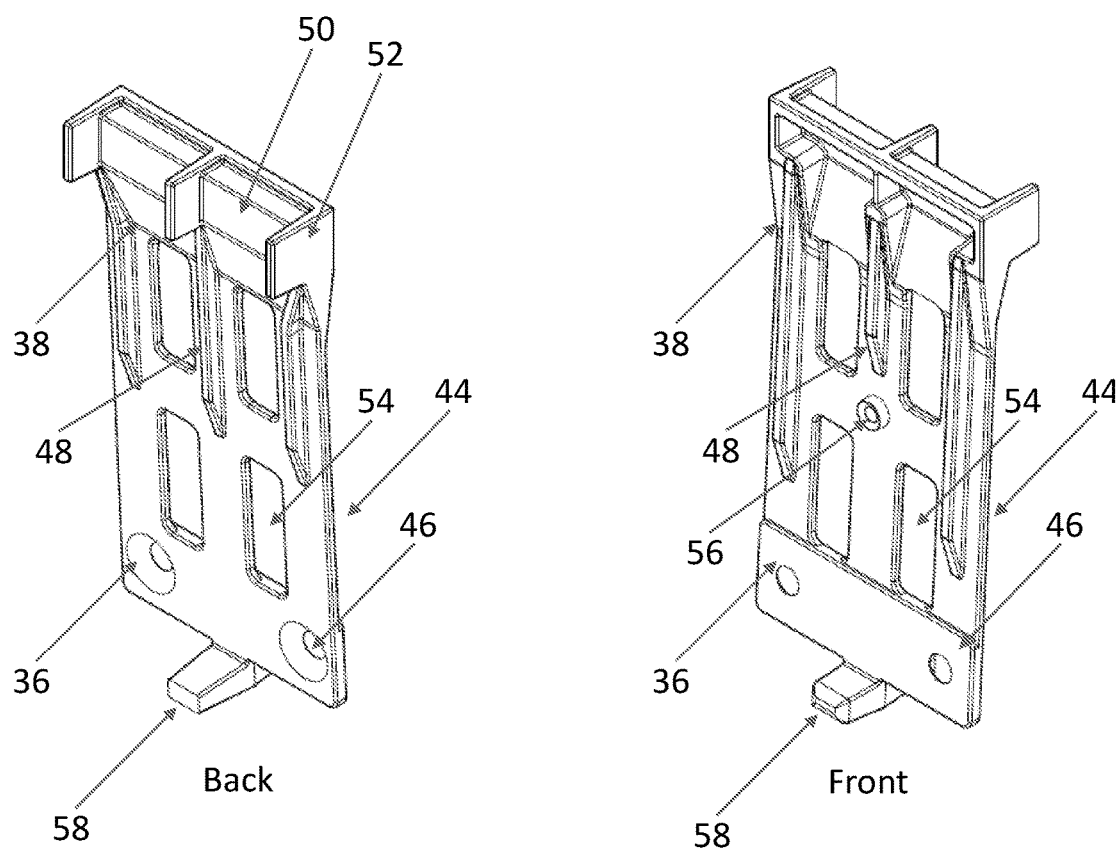
FIG. 4 is a series of perspective views of one exemplary embodiment of the lever member of the present invention.

Referring now specifically to FIG. 4, in one exemplary embodiment, the lever member 34 includes a substantially planar portion 44 that defines a plurality of screw holes 46 by which the first end 36 of the substantially planar portion 44 is attached to the faceplate 22 (FIGS. 1-3). A plurality of stiffening ribs 48 or the like are used to provide the substantially planar portion 44 with a predetermined degree of rigidity and prevent the substantially planar portion 44 from warping or twisting when actuated. A plurality of switch contact surfaces 50 are provided to engage the switches (not illustrated) of the electronic fan brake (not illustrated) when the substantially planar portion 44 is actuated. A plurality of stop structures 52 are provided to prevent over actuation of the substantially planar portion 44. A plurality of holes 54 are formed in the substantially planar portion 44 in order to limit weight and material usage, and a contact recess 56 is provided to selectively receive the protruding portion of the captive screw 16 (FIGS. 1 and 2). Finally, a light pipe 58 is provided to transmit light from the interior of the cooling unit 10 (FIG. 1) and/or the shelf assembly (not illustrated) to the exterior of the faceplate 22 to indicate to the operator that the cooling unit 10 is fully engaged/disengaged, for example. All of the components of the cooling unit 10 and latch assembly 12 (FIGS. 1-3) may be manufactured from a metal, a molded plastic, or any other suitably rigid material. It will be readily apparent to those of ordinary skill in the art that other suitable lever mechanisms or mechanisms for actuating the switches of the electronic fan brake may also be utilized.

Figure 5:
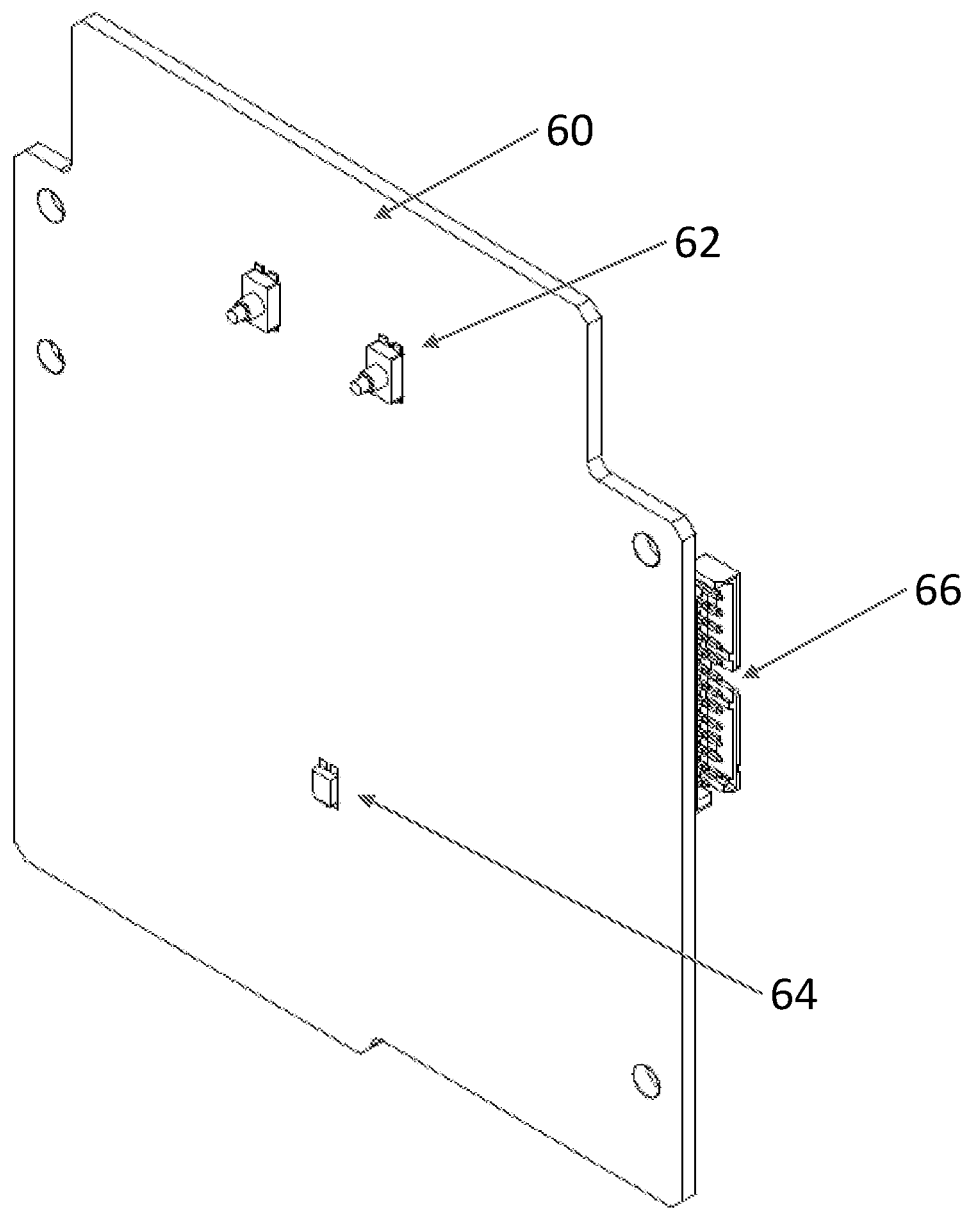
FIG. 5 is a perspective view of one exemplary embodiment of a printed circuit board (PCB) of the present invention including electronic fan brake switches and a light emitting diode (LED)

Referring now specifically to FIG. 5, in one exemplary embodiment, the PCB 60 of the cooling unit 10 (FIG. 1) includes a plurality of redundant switches 62 operable for enabling/disabling the electronic fan brake (not illustrated), a LED 64 operable for illuminating the light pipe 58 (FIG. 4), and a plurality of electrical connections 66. Preferably, each of the switches 62 utilizes a depressible trigger mechanism or the like.

Figure 6:
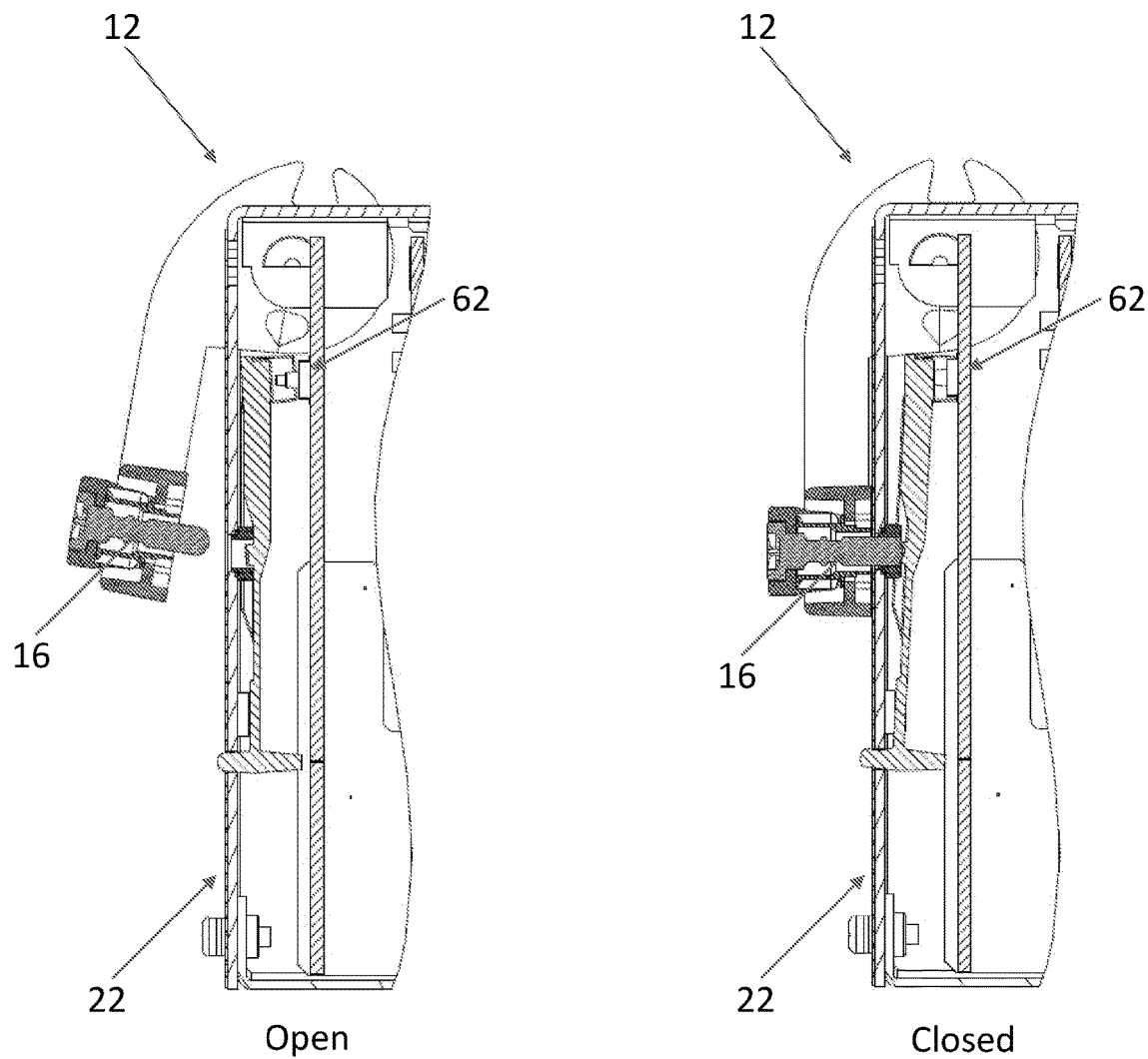
FIG. 6 is a series of cross-sectional side views of one exemplary embodiment of the latch assembly of the present invention, in open (fan disabled) and closed (fan enabled) configurations.
Figure 7:
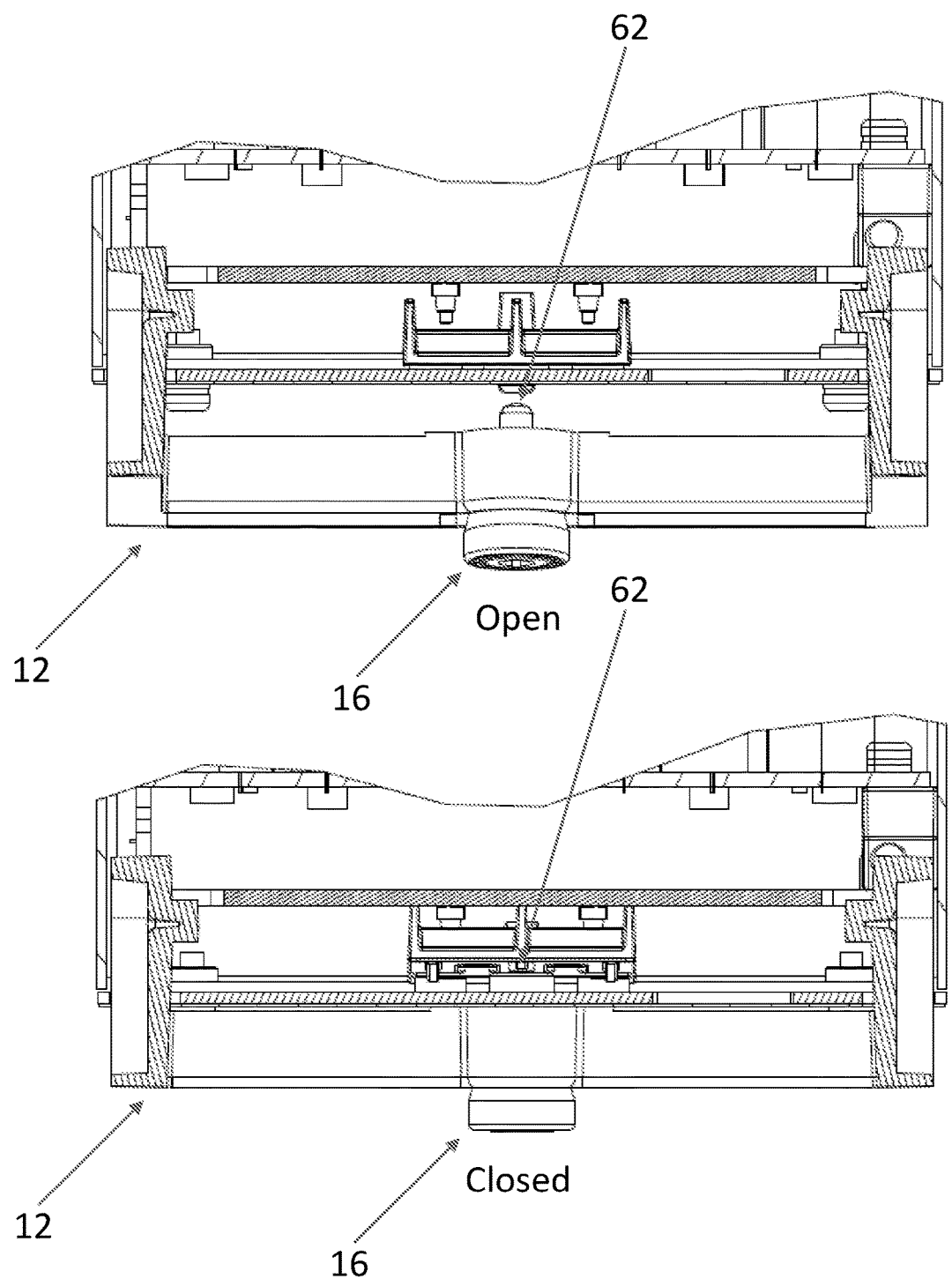
FIG. 7 is a series of top planar views of one exemplary embodiment of the latch assembly of the present invention, in open (fan disabled) and closed (fan enabled) configurations.

FIGS. 6 and 7 illustrate the depression of the switches 62 by the latch assembly 12 and the captive screw 16, thereby disabling the electronic fan brake and allowing the fans to spin up.

Although the present invention is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following claims.

What is claimed is:

1. A latch assembly for a cooling unit of a telecommunications shelf assembly, the latch assembly comprising:

a faceplate;

a latch handle movably coupled to the faceplate, wherein, when the latch handle is actuated, the cooling unit is attached to/released from the shelf assembly; and a locking mechanism coupled to the latch handle, wherein, when the locking mechanism is actuated, the cooling unit is locked to/unlocked from the shelf assembly;

wherein the locking mechanism comprises a fan brake actuator mechanism that is coupled to an electronic fan brake switch associated with one or more fans of the cooling unit, wherein the electronic fan brake switch engages an electronic brake on the one or more fans when the electronic fan brake switch is opened.

2. The latch assembly of claim 1, wherein the latch handle is pivotably coupled to the faceplate and is actuated by rotation.

3. The latch assembly of claim 1, wherein the locking mechanism comprises a captive screw that is advanced into/backed out of a threaded aperture associated with the faceplate.

4. The latch assembly of claim 1, wherein the fan brake actuator mechanism comprises a lever member that couples the locking mechanism to the electronic fan brake switch.

5. The latch assembly of claim 4, wherein a first end of the lever member is coupled to the faceplate, wherein a second end of the lever member contacts the electronic fan brake switch, and wherein the locking mechanism contacts the lever member between the first end and the second end of the lever member.

6. The latch assembly of claim 4, wherein the lever member comprises a light pipe that transmits light from an interior portion of the cooling unit to an exterior portion of the cooling unit.

7. A cooling unit of a telecommunications shelf assembly, the cooling unit comprising:

a faceplate; and a latch assembly, comprising:
- a latch handle movably coupled to the faceplate, wherein, when the latch handle is actuated, the cooling unit is attached to/released from the shelf assembly; and
- a locking mechanism coupled to the latch handle, wherein, when the locking mechanism is actuated, the cooling unit is locked to/unlocked from the shelf assembly;
- wherein the locking mechanism comprises a fan brake actuator mechanism that is coupled to an electronic fan brake switch associated with one or more fans of the cooling unit, wherein the electronic fan brake switch engages an electronic brake on the one or more fans when the electronic fan brake switch is opened.

8. The cooling unit of claim 7, wherein the latch handle is pivotably coupled to the faceplate and is actuated by rotation.

9. The cooling unit of claim 7, wherein the locking mechanism comprises a captive screw that is advanced into/backed out of a threaded aperture associated with the faceplate.

10. The cooling unit of claim 7, wherein the fan brake actuator mechanism comprises a lever member that couples the locking mechanism to the electronic fan brake switch.

11. The cooling unit of claim 10, wherein a first end of the lever member is coupled to the faceplate, wherein a second end of the lever member contacts the electronic fan brake switch, and wherein the locking mechanism contacts the lever member between the first end and the second end of the lever member.

12. The cooling unit of claim 10, wherein the lever member comprises a light pipe that transmits light from an interior portion of the cooling unit to an exterior portion of the cooling unit.

13. A method for providing and using a latch assembly for a cooling unit of a telecommunications shelf assembly, the method comprising:

providing a faceplate;

providing a latch handle movably coupled to the faceplate, wherein, when the latch handle is actuated, the cooling unit is attached to/released from the shelf assembly;

providing a locking mechanism coupled to the latch handle, wherein, when the locking mechanism is actuated, the cooling unit is locked to/unlocked from the shelf assembly;

wherein the locking mechanism comprises a fan brake actuator mechanism that is coupled to an electronic fan brake switch associated with one or more fans of the cooling unit, wherein the electronic fan brake switch engages an electronic brake on the one or more fans when the electronic fan brake switch is opened;

actuating the locking mechanism to actuate the electronic fan brake switch; and actuating the latch handle to attach the cooling unit to/release the cooling unit from the telecommunications shelf assembly.

14. The method for using the latch assembly of claim 13, wherein the latch handle is pivotably coupled to the faceplate and is actuated by rotation.

15. The method for using the latch assembly of claim 13, wherein the locking mechanism comprises a captive screw that is advanced into/backed out of a threaded aperture associated with the faceplate.

16. The method for using the latch assembly of claim 13, wherein the fan brake actuator mechanism comprises a lever member that couples the locking mechanism to the electronic fan brake switch.

17. The method for using the latch assembly of claim 16, wherein a first end of the lever member is coupled to the faceplate, wherein a second end of the lever member contacts the electronic fan brake switch, and wherein the locking mechanism contacts the lever member between the first end and the second end of the lever member.

18. The method for using the latch assembly of claim 16, wherein the lever member comprises a light pipe that transmits light from an interior portion of the cooling unit to an exterior portion of the cooling unit.

* * * * *